United States Patent [19]

Ahuja et al.

[11] Patent Number: 5,021,684
[45] Date of Patent: Jun. 4, 1991

[54] PROCESS, SUPPLY, TEMPERATURE COMPENSATING CMOS OUTPUT BUFFER

[75] Inventors: Bhupendra Ahuja, Phoenix; Donald Sollars, Tempe, both of Ariz.

[73] Assignee: Intel Corporation, Santa Clara, Calif.

[21] Appl. No.: 434,021

[22] Filed: Nov. 9, 1989

[51] Int. Cl.$^5$ .............................................. H03K 17/16
[52] U.S. Cl. .................................. 307/443; 307/473; 307/263; 307/546; 307/296.8
[58] Field of Search ............... 307/443, 473, 263, 546, 307/296.8

[56] References Cited

U.S. PATENT DOCUMENTS

| | | | |
|---|---|---|---|
| 4,638,187 | 1/1987 | Boler et al. | 307/473 |
| 4,725,982 | 2/1988 | Hara et al. | 307/473 |
| 4,760,292 | 7/1988 | Bach | 307/443 |
| 4,857,770 | 8/1989 | Pantovi et al. | 307/296.8 |
| 4,928,023 | 5/1990 | marshall | 307/263 |

FOREIGN PATENT DOCUMENTS 0294123  11/1988  Japan ................................. 307/473

Primary Examiner—Stanley D. Miller
Assistant Examiner—Scott A. Ouellette
Attorney, Agent, or Firm—Blakely, Sokoloff, Taylor & Zafman

[57] ABSTRACT

A design for a high performance CMOS output buffers utilizing a process, supply and temperature conpensated current source to achieve very tight distribution of rise/fall times and propagation delays. The output buffer has been optimized to limit switching noise by using current controlled predrivers. An output buffer according to the present invention can switch up to a 100 pf load to TTL levels with rise times of no more than 4.0 ns and propagation delays ranging from 2.1 ns to 11.6 ns over the entire range of process, supply, temperature, and load for a typical one micron CMOS process; Vcc from 4.5 to 5,5V, temperature from −10 to 120° C., and loads from 10 to 100 pf.

11 Claims, 6 Drawing Sheets

PROCESS, SUPPLY, TEMPERATURE COMPENSATING CMOS OUTPUT BUFFER

FIELD OF THE INVENTION

The present invention relates to large scale integrated circuits and specifically, implementations of output drivers or buffers in such circuits.

BACKGROUND OF THE INVENTION

Output drivers, which are also called output buffers, of large scale integrated circuits ("chips")—when they switch—generate noise in the chip's power supply lines. As the performance of the output buffer changes with temperature, process, and voltage, so does the noise. For a good design, the noise should be restricted to levels set by the circuit designer based upon the characteristics of the particular chips used in the design. This requires that the output buffer have a steady performance. The present invention is directed to a new output buffer design which is compensated to give steady performance for changes in temperature, process, and power supply voltage.

PRIOR ART OUTPUT BUFFER

A typical prior art output buffer is shown in FIG. 1. The buffer comprises a large P type transistor (PMOS), and a large N type transistor (NMOS). These large transistors are capable of driving a large external load. The transistors are broken down into multiple small transistors in parallel. FIG. 1 shows them as broken down into groups of three each, transistors 11a-11c (PMOS) and 13a-13c (NMOS). The gates of the transistors, however, are connected in series using resistors Rp. These resistors are formed by polysilicon interconnection layers. Usually such resistance is not desirable in chip circuitry, and chip designers tend to use designs which avoid this resistance. However, in the case of output buffers, the resistance is used at an advantage. The two driver transistors are each connected to an inverter 15 and 17, called predrivers. An internal input 18 generated by the chip drives the predrivers, the predrivers drive the drivers, and the drivers drive the external load by placing a signal on its corresponding pin or pad 19.

The pre-driver 17 of the P type driver has large P transistor, and a small N transistor in it. Similarly, the N transistor predriver 15 has a small P and large N transistor. When the input signal 18 makes a logic 0 to a logic 1 transition, the output of the driver makes a similar transition. However, the following chain of events take place in between. Assume the input to the pre-drivers 17 and 15 is a logic 1, so their P transistors are turned off, and their N transistors are turned on. The N transistor of the N predriver is larger than the N transistor of the P pre-driver, so the N driver's gate is discharged to 0 volts faster than the P transistor's gate. This ensures that the N driver is turned off faster. Now, since the P driver's gate is also being discharged (although more slowly), it starts conducting, and pulls the output node 19 to the power supply voltage 21, or logic 1. The resistors Rp delay switching of individual transistors of the driver, due to RC delay; where R is the resistance of the polysilicon interconnect, and C is the gate capacitance. Thus, the individual transistors 11a-11c and 13a-13c are gradually turned on/off. This reduces current spikes in the power supply, and subsequently reduces noise. Similarly, for a logic 1 to 0 transition, the N driver is active, and similar events take place.

PERFORMANCE OF THE PRIOR ART DRIVER

Prior art output buffers are found to be adequate for most designs. However, as higher performing chips are developed, the performance of prior art output buffers is severely limiting. For example, with new VLSI processes capable of high performance, it is necessary to reduce the resistances between the transistors of the output drivers. However, reducing such resistances results in higher noise. For a typical 50 pf driver, the results are tabulated in Table I.

TABLE I

| Temperature degrees C | Supply Voltage volts | Lo to Hi delay nano-seconds | Hi to Lo delay nano-seconds | di/dt Power ma/ns | di/dt Ground ma/ns |
|---|---|---|---|---|---|
| 0 | 5.0 | 3.8 | 3.9 | 38 | 42 |
| 120 | 4.0 | 6.2 | 6.1 | 10 | 11 | where di/dt is the rate of change of current in milliamps/nano-sec.

The results in Table I take into consideration changes in temperature, and supply voltage, but do not reflect changes in process. However, even without considering process variation, the delay changes from about 6 nanoseconds to about 4 nano-seconds when the temperature changes from 120° to 0° Celsius. If the driver is designed for the worst case of 120° C., then the design would have been acceptable since drivers speed up at low temperatures and thus have improved performance. However, the noise on the power supply lines also increase as the drivers speed up. Specifically, as shown in Table I, the rate of change of current (di/dt) also increases as the drivers speed up. This (di/dt) causes a voltage drop across the power supply bond-wires and pins due to the inductance of the bond-wires and pins. This voltage drop appears as noise on the signal and is given by:

$$V_{noise} = L \frac{di}{dt}$$

where L is the total inductance in the path. Typically more than one output driver is connected to the power supply bond-wires and pins. Thus, the noise voltage is multiplied by the number of drivers connected. For example, ten drivers would give $10 \times 3 \times 10 = 300$ millivolts of noise at 120° C. (Inductance is about 3 nanohenries). The same design would give 1200 millivolts of noise at 0° C. Inasmuch as the TTL output level for logic low is 800 millivolts, a chip which works at 120° C. would fail to work with TTL logic at 0° C. Such a drastic change in noise is not acceptable for high performance chips.

For example, the design of high speed output buffers for use in high performance microprocessors ($\mu$P), microcontrollers ($\mu$C), and peripheral controllers operating at clock rates above 30 MHz presents some challenging requirements. Key issues which must be considered in the design of such high speed buffers include control of rise/fall time and propagation delay over process, supply, temperature, and load variations to some absolute number which decreases as frequency of operation increases.

A side effect of high frequency operation is switching noise on the power and ground lines on the chip which could cause malfunctioning as well as create some new critical speed paths to hamper normal operation. In multilayered packages, the lead inductances on different pins, ranging from 1 to 40 nh, can generate over 1.5 volts of noise on the power and ground lines at frequencies above 30 MHz. Output buffers provide a significant contribution to this noise due to a large number of heavily loaded buffers switching simultaneously. For example, an Intel 80C486 $\mu$P can have up to 64 output buffers switching simultaneously on a clock edge. Thus, the design of output buffers becomes critical and must be optimized to reduce switching noise.

A paper describing an on-chip process dependent control voltage source which regulates the charge/discharge rate of a series transistor in an output buffer is Gabara, Thompson "Ground Bounce Control In CMOS Integrated Circuits," ISSCC, Feb. 17, 1988, digest pages 88-89. In particular, FIG. 1(b) illustrates a voltage controlled tri-stateable output buffer.

SUMMARY OF THE INVENTION

A novel design is disclosed for high performance CMOS output buffers. The design utilizes a process, supply and temperature compensated current source to achieve very tight distribution of rise/fall times and propagation delays. The output buffer has been optimized to limit switching noise by using current controlled predrivers.

An output buffer according to the present invention can switch up to a 100 pf load to TTL levels with rise times of no more than 4.0 ns and propagation delays ranging from 2.1 ns to 11.6 ns over the entire range of process, supply, temperature, and load for a typical one micron CMOS process; Vcc from 4.5 to 5.5 V, temperature from $-10°$ to $120°$ C., and loads from 10 to 100 pf. These numbers were obtained using a package environment where four such buffers switch simultaneously on one set of power pads.

DETAILED DESCRIPTION OF THE INVENTION

Figure 2:
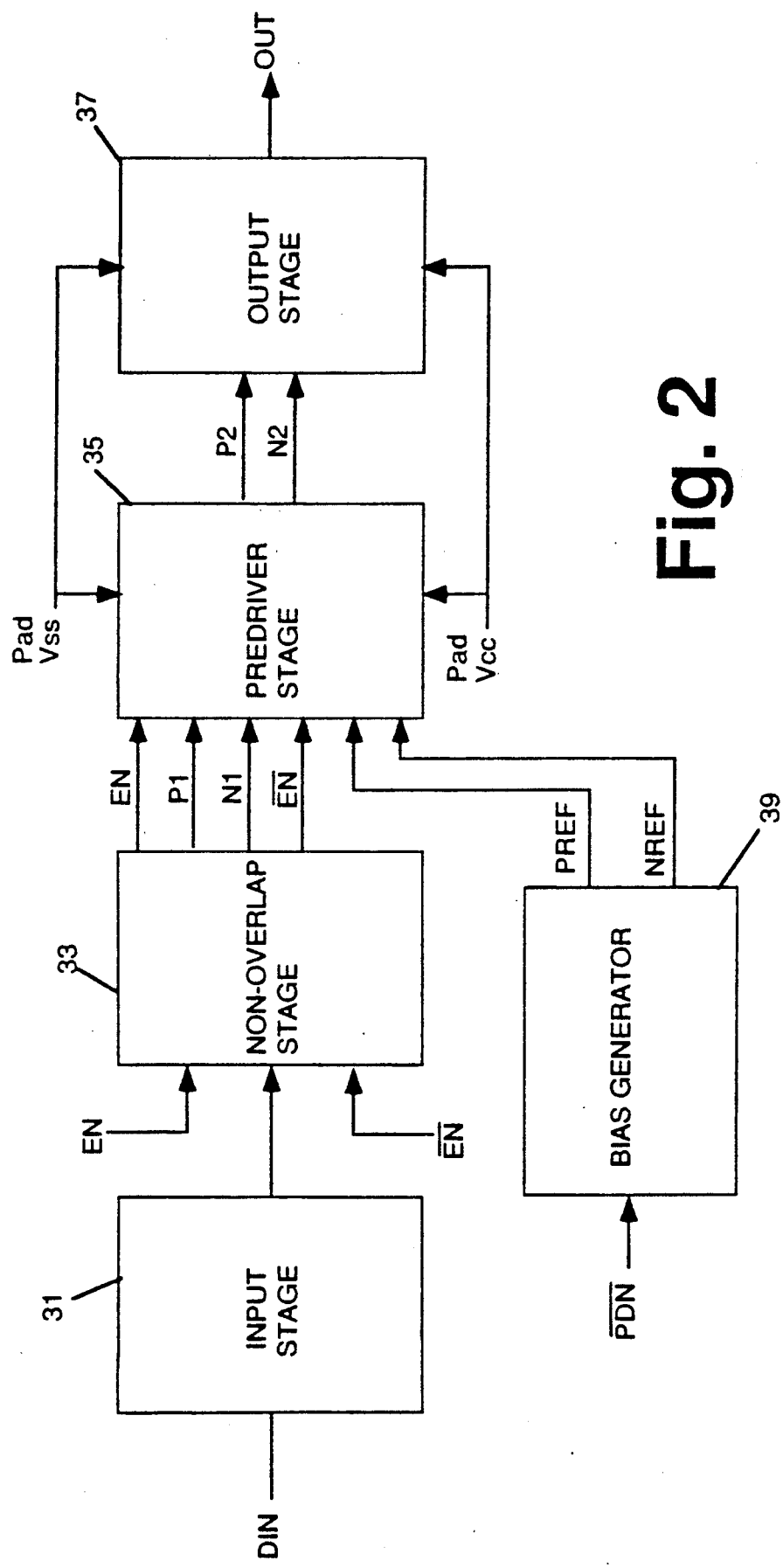
FIG. 2 is a block diagram showing the various functional components of the invented output buffer.

A simplified block diagram of the invented output buffer is shown in FIG. 2. In order to drive loads up to 100 pf, a four stage design is utilized, namely input stage 31, non-overlap stage 33, predriver stage 35 and output stage 37. To minimize propagation delays, each stage drives no more than four times its input gate capacitance. In order to reduce switching noise transients, each stage is designed so that there is no simultaneous turning ON of P and N devices during their input transition periods. The various inputs and outputs to the four stages will be described below with reference to the description of FIG. 3. Bias generator 39 will be described below with reference to FIG. 5.

Figure 3:
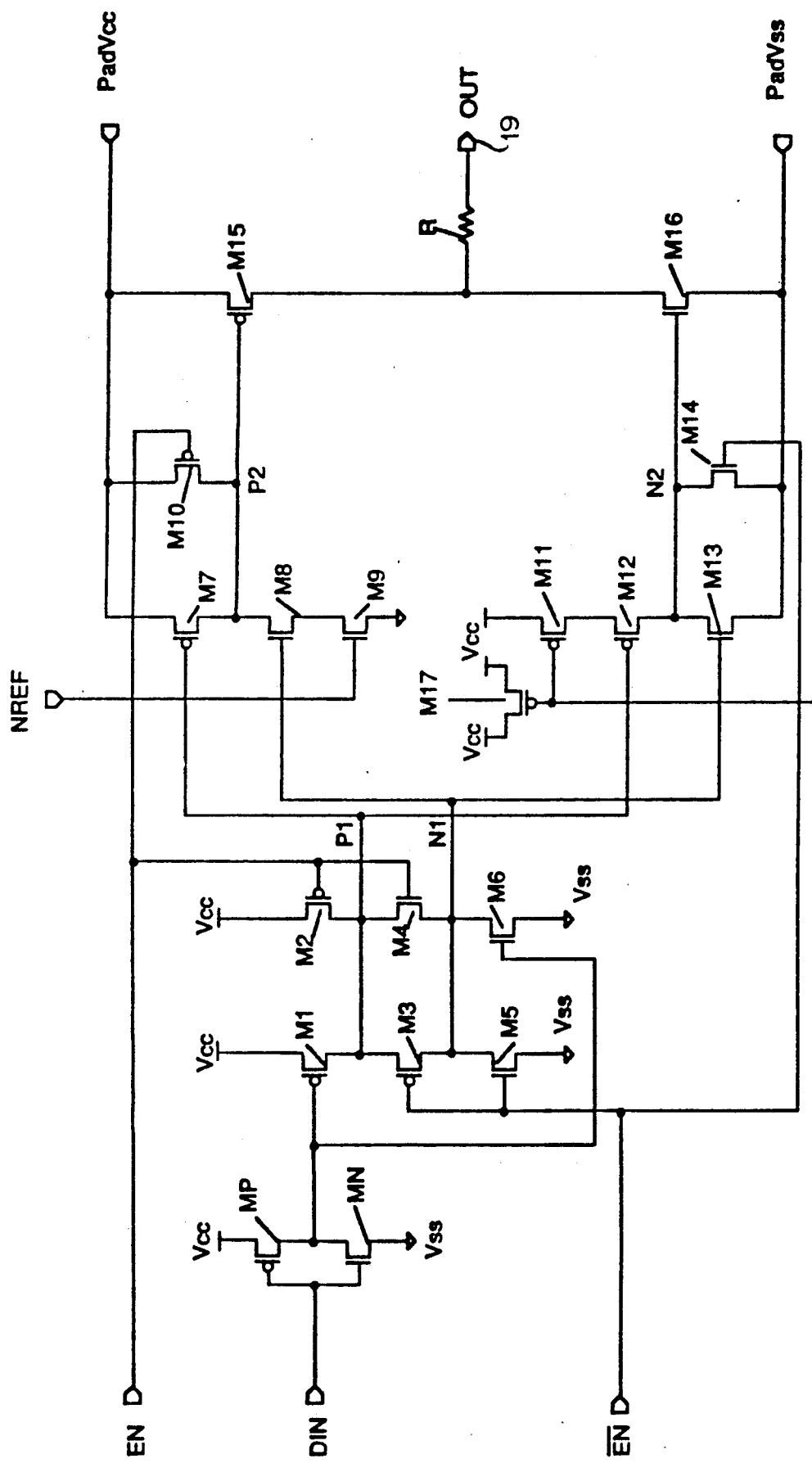
FIG. 3 is a schematic diagram of one embodiment of the invented output buffer.
Figure 3A:
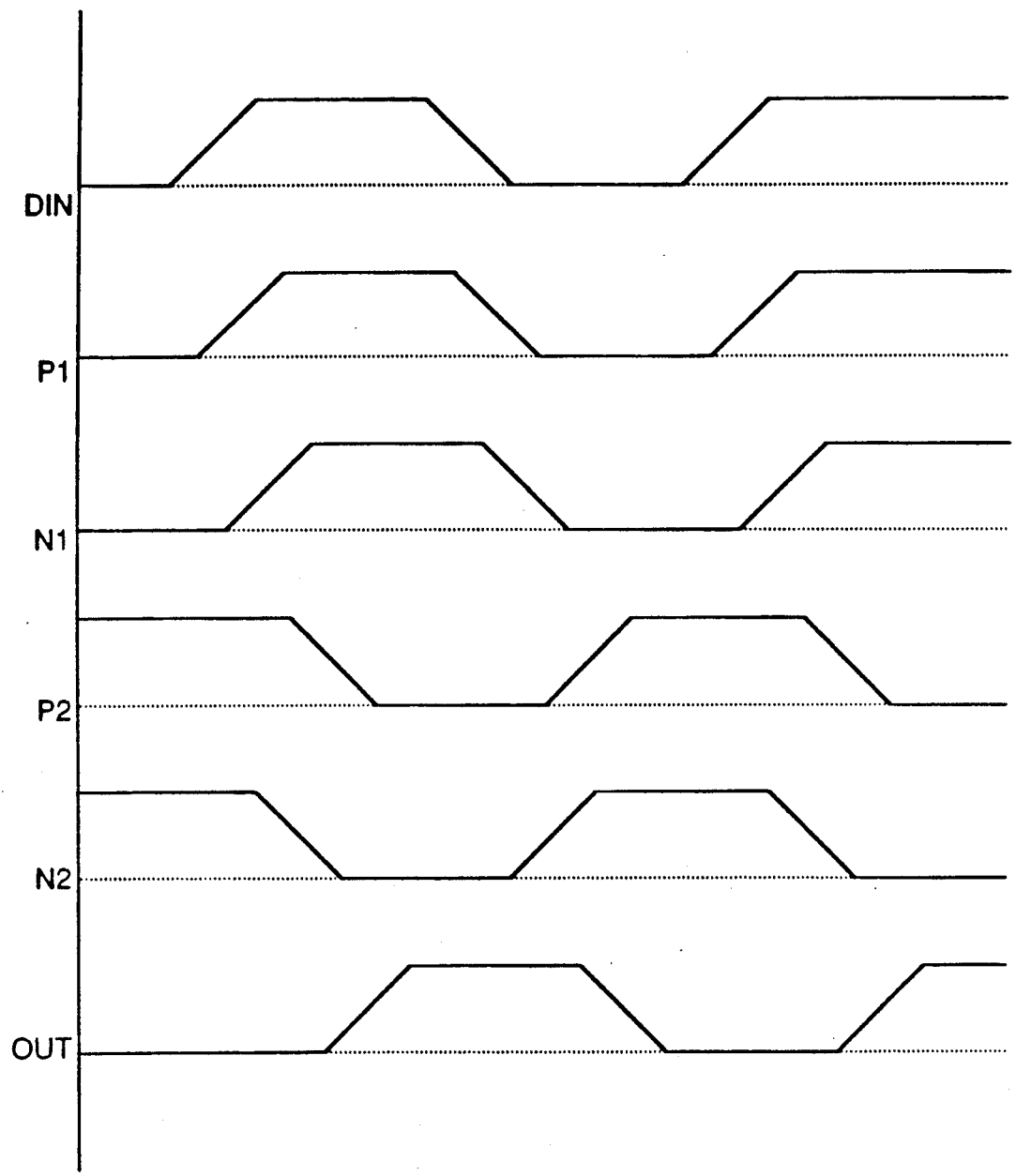
FIG. 3a is a timing chart showing the timing waveforms of various internal nodes of the invented output buffer.

Referring to FIG. 3, DIN is the input signal to input stage 31 formed by transistors MP and MN which form a simple inverter. DIN is the internal signal which corresponds to the signal OUT which is to be placed on output pad 19 for the corresponding buffer. Non-overlap stage 33 formed by transistors M1 thru M6, provides signals at nodes P1 and N1 which behave as shown in FIG. 3a (with EN=HI and /EN=LO). EN and /EN are tri-state control signals for the buffer. EN and /EN are generated by control logic not associated with the output buffer. When the output is to make a 0 to 1 transition, node P1 charges to Vcc first and then node N1 follows. When the output goes from 1 to 0, node N1 discharges to Vss first and then node P1 follows. Thus, for predriver stage 35 (transistors M7-M14) whose p-gate is tied to node P1 and n-gate is tied to node N1, the p and n devices never turn ON simultaneously during an input signal DIN transition. Thus, no direct current path is allowed between Vcc and Vss. This non-overlap is controlled by sizing transistors M3 and M4 with respect to the gate capacitance of the predriver stage. The EN and /EN signals cause P1 to go to Vcc and N1 to Vss, thus turning OFF the p-gate and n-gate of the predriver stage to enable the output to be tri-stated (EN=LO,/EN=HI).

The predrivers for output transistors M15 and M16 each produce a current controlled stage formed by transistors M7, M8, M9 and M10 for transistor M15 and transistors M11, M12, M13 and M14 for transistor M16. The predrivers perform an inverting function with their currents controlled by the two bias voltages produced by bias generator 39, NREF for the n predriver and PREF for the p predriver. When node P1 is taken LOW, transistor M7 is used to charge node P2 to Vcc which causes transistor M15 to be turned off quickly. However, transistor M15 turns ON slowly due to the constant current established in transistor M9 by its gate to source voltage NREF. Transistor M10 is used to turn OFF transistor M15 during tri-state (/EN=LO) and is needed because the second stage only tri-states the predrivers, which leaves node P2 floating. A similar discussion applies for output n-transistor M16 and its predriver formed by transistors M11, M12, M13 and M14.

By examining the timing waveforms for the different nodes in FIG. 3a, it is noted that transistors M15 and M16 never turn ON simultaneously during the transition region. By controlling NREF and PREF, the output charging and discharging rates can be controlled independently (i.e, the rise and fall times as well as the di/dt of transistors M15 and M16). Because of these features, the buffer design is scaleable for different switching parameters such as rise/fall delay times as well as different load requirements.

Figure 1:
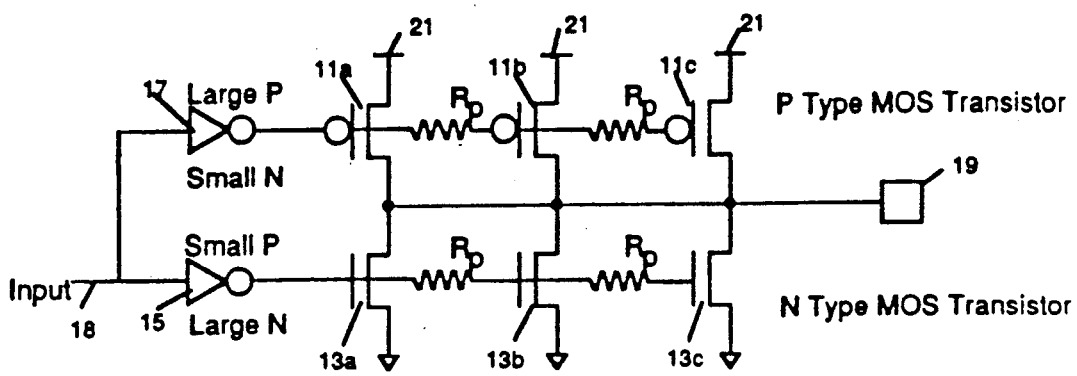
FIG. 1 is a schematic representation of a prior art output buffer.
Figure 4:
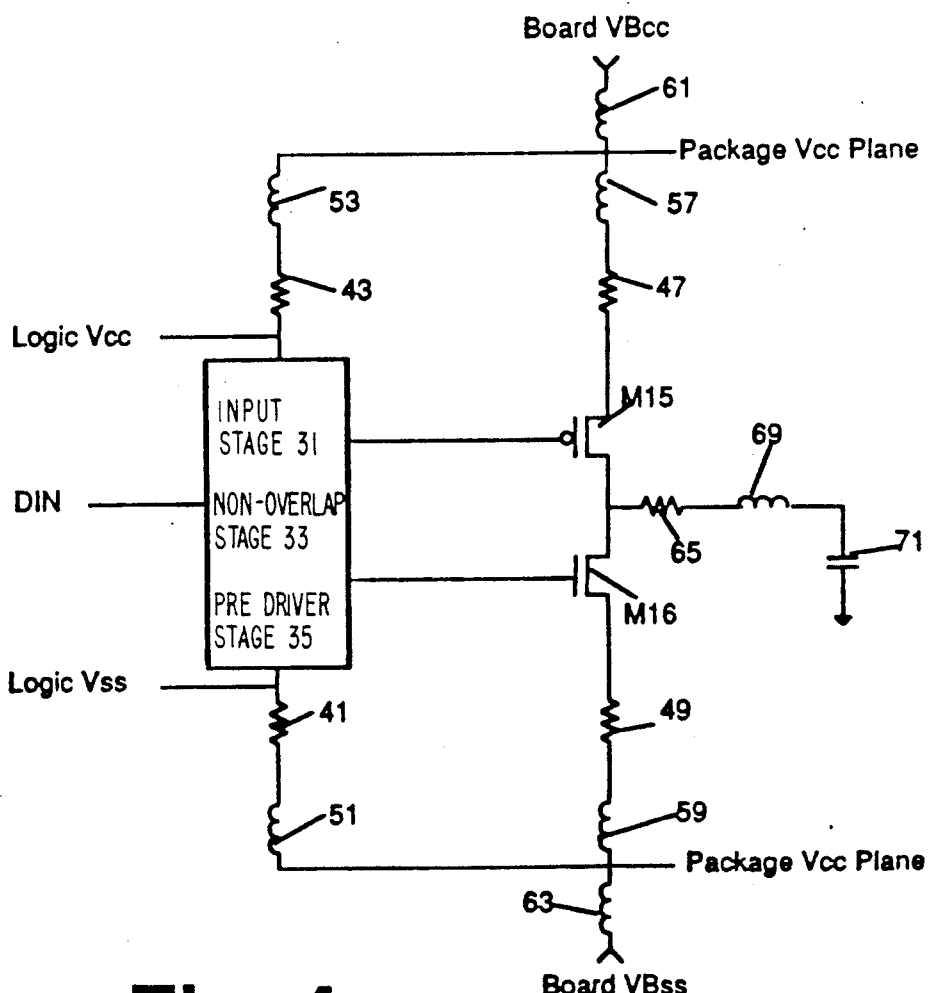
FIG. 4 is a schematic representation of a typical package and board environment for the invented output buffer.

To reduce switching noise, output stage devices, M15 and M16, receive their power from separate Vcc and Vss supplies, i.e., PadVcc and PadVss rather than Vcc and Vss for input stage 31, non-overlap stage 33 and parts of predriver stage 35. Also, since transistors M7 and M13 generate substantial switching noise and they switch in a direction opposite to that of output stage devices M15 and M16, overall switching current in PadVcc/PadVss can be reduced by tying devices M10, M7 and M15 to PadVcc and devices M13, M14 and M16 to PadVss. Transistor M17 helps reduce switching noise transients on the PREF bias line by acting as a low-pass filter. Resistor R plays an important role in controlling switching noise as well as output voltage overshoot and undershoot around its steady state values of Vcc and Vss. FIG. 4 shows a typical package and board environment for such an output buffer with signal and power lead inductances.

The invented output buffer is implemented in a 50 pf and 100 pf TTL drive capacity design using device scaling in a typical CMOS process.

The AC switching characteristics can be controlled over process, supply and temperature (PST) variations by the bias currents NREF and PREF in predriver stage 35. If the bias current in the predriver is increased as the process moves toward slow corner or temperature increases (causing output devices to slow down), or supply voltage decreases, it is possible to achieve better control of switching parameters tr (rise time), tf (fall time), and tpd (propagation delay from input to output) of the output buffer. The design of a bias network which provides these characteristics to the output buffer is described below.

Figure 5:
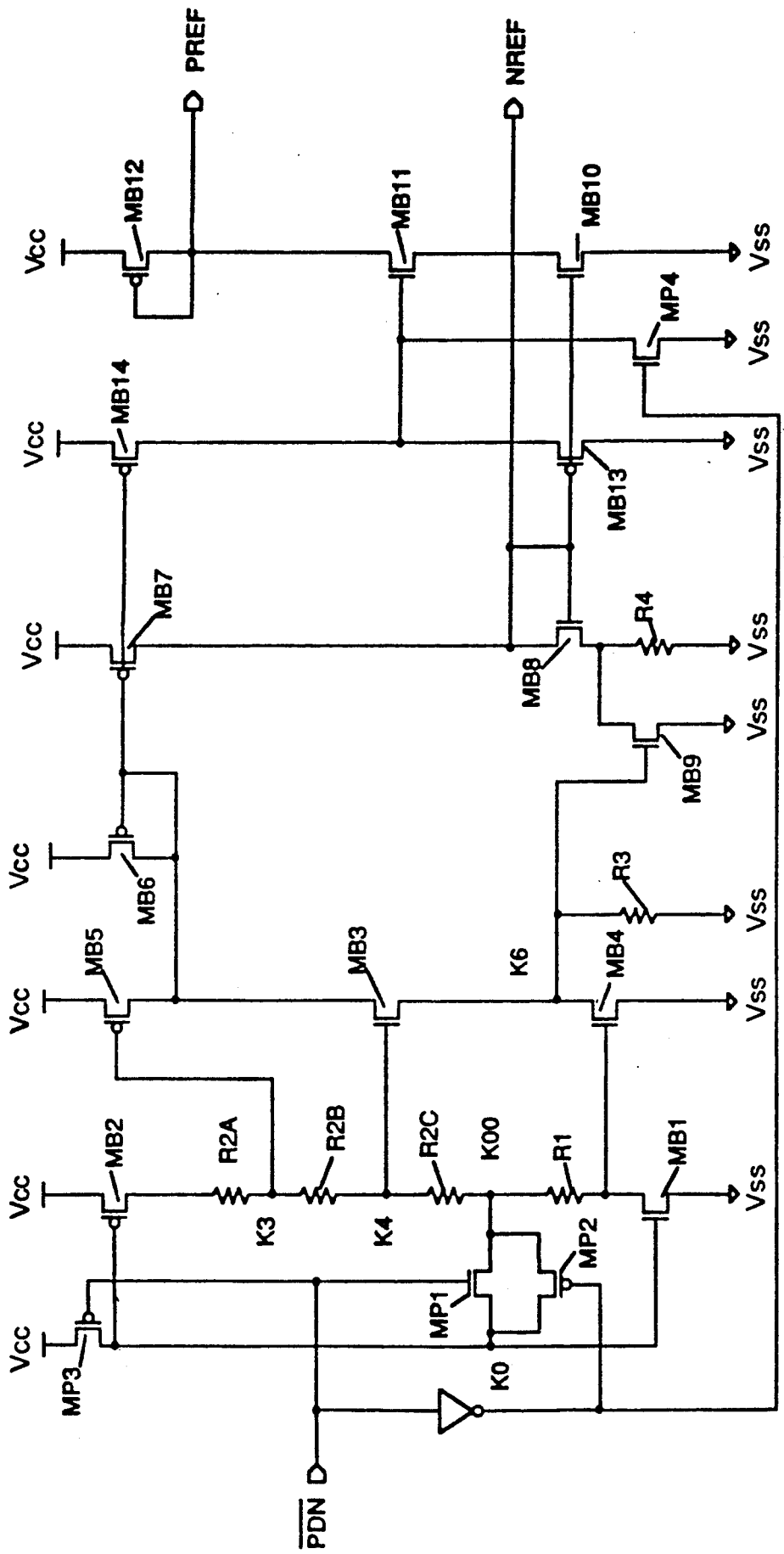
FIG. 5 is a schematic diagram of an embodiment of bias generator 39.

Bias generator 39 which is shown in detail in FIG. 5, provides two signals, NREF and PREF, to control the bias currents in the n and p predrivers of predriver stage 35 of the output buffer. By making the NREF and PREF voltages increase for slow process, or higher temperature or lower Vcc, the desired effect of controlling the switching parameters of the output buffer to within tighter limits is achieved.

The operation of the bias circuit, shown in FIG. 5, can be explained by first analyzing the operation of transistors MB1 to MB5 and then current mirror transistors MB7 to MB12. To illustrate this, for a transistor with a resistor R in series with its drain, the relationship between gate to source voltage, V, drain current, I, and drain to source voltage, Vds, is given by:

$$V = I*R + Vds, \text{ and}$$
$$I = 0$$
$$= beta*(V - Vt - Vds/2)Vds$$
$$= 0.5*beta*(V - Vt)**2$$

for $V < Vt$; cut-off region
for $V - Vt > Vds$; linear region
for $Vds > V - Vt$; saturation region.

where Vt and beta are device threshold voltage and gain respectively.

As V is increased above 0, the transistor first stays in its cutoff region until V=Vt. During this time, Vds equals V. Then the transistor goes into its saturation region with I increasing in a square law fashion and Vds dropping, until finally the device enters its linear region with current I becoming almost flat with increasing V due to decreasing Vds.

Referring back to FIG. 5, transistors MB1-MB6 with resistors R1-R3 form a reference current generation stage as follows. Transistor MB1 and resistor R1 are coupled with complementary p-channel transistor MB2 and resistors R2A, R2B and R2C. The device sizes are chosen such that under fast process corner, low temperature ($-10°$ C.), and high supply voltage (5.5 V), both transistors MB1 and MB2 are biased in their linear regions. Now, as process, voltage and temperature corners move in the direction of current reduction for transistors MB1 and MB2, these devices will move out of their linear regions into saturation, resulting in increases in their drain-source voltages, Vdsn and Vdsp. By making Vdsn and Vdsp lower than N and P- channel thresholds at the fastest process corner, lowest temperature and highest supply corner, and slowly increasing them above the Vt's of the n and p devices, the node voltages can be used to change the current in the following stage formed by transistors MB3 thru MB5.

Proper choice of transistors MB1 and MB2, and resistors R1 and R2 (R2A, R2B and R2C) should result in increasing voltage at node K0 for slower process, voltage and temperature corners (implying lower drain current ,ID, for any MOS transistor), and cause node K1 to exceed Vtn only under slow process corner. Node K4 in the resistor network of R1 and R2 is chosen at a point where process and temperature have very little effect (only supply voltage affects it) while node K3 is chosen so as to turn on a P-channel device under fast PST and slowly turn off as PST moves toward slow corner.

Node K4 is used to set up a current in transistor MB3 thru a resistor R3. This current, ID3, of transistor MB3 is greatly increased by transistor MB4 which shunts R3 under slow PST. The current ID3 is divided into two P-channel transistors MB5 and MB6. By tying the gate of transistor MB5 to node K3 and thus keeping transistor MB3 ON in fast PST and OFF in slow PST, current can be further increased in transistor MB6 as PST moves from fast to slow corner.

Transistors MB7-MB9 and resistor R4 form an NREF bias voltage output stage as follows. The drain current of transistor MB6 is mirrored into transistor MB7 by keeping the same Vgs and similar Vds's across both devices and by having the same channel length. ID7, the drain current of transistor MB7, flows through a series combination of resistor R4 and gate/drain connected transistor MB8. In order to create a further increase in predriver currents under slow PST corner, transistor MB9 is used to shunt all the current from resistor R4 in fast PST corner while remaining OFF in slow corner. As previously noted, resistor R3 and thus node K6 are shorted to Vss in slow PST corner by transistor MB4. Thus, by using node K6 as the gate to source voltage for transistor MB9, NREF has the following characteristics:

$$NREF = Vgs8 \quad \text{(for } ID8 = ID7 \text{ under fast } PST \text{ corner),}$$
$$= (Vgs8 + ID7*R4) \quad \text{(for } ID8 = ID7 \text{ under slow } PST \text{ corner).}$$

where Vgs8 is gate/source voltage for transistor MB8.

Thus, the drain current of transistor MB10 and transistor MB12 is given by:

$$ID10, ID12 = ID6 = 0.5*ID7 \text{ for fast } PST \text{ corner, and}$$
$$= ID6 + 0.5b10*(ID7*R4)^2 + \sqrt{2b10}*(ID7*R4)^{1.5} \text{ for slow } PST \text{ corner.}$$

where ID6, ID10 and ID12 are drain currents of transistors MB6, MB10 and MB12 respectively and b20* is the beta of transistor MB10.

This implies that ID10 and ID12 stay the same as ID6 in a fast PST corner while increasing in a quadratic manner for a slow PST corner.

By routing signals PREF and NREF to p-channel and n-channel devices of the same channel length as transistor MB12 and transistor MB10, their drain currents can be mirrored into output buffer predriver stage 35. The source follower network (transistors MB13 and MB14) is used to limit Vds across transistor MB10 to avoid any impact ionization problems. In this manner, transistors M10–M14 form a PREF bias voltage output stage.

Transistors MP1–MP4 are used for power down mode to turn off all currents in the bias generator. For normal operation, the signal /PDN which is generated externally is HI and thus transistors MP1 and MP2 are ON, providing a short circuit between nodes KO and KOO, while transistors MP3 and MP4 are open.

Other Applications of Temperature Compensated Bias Generator

The bias generator circuit can be used to advantage in other circuits on the chip to reduce noise and improve performance. Most applications have an address and/or data bus which must switch at very high speeds. By creating slight timing skews in the buffer inputs, the overall switching noise can be reduced substantially. Using this bias generator, a latch may be designed to provide substantial skew at the fast corner with minimum delay at the slow corner.

Figure 6:
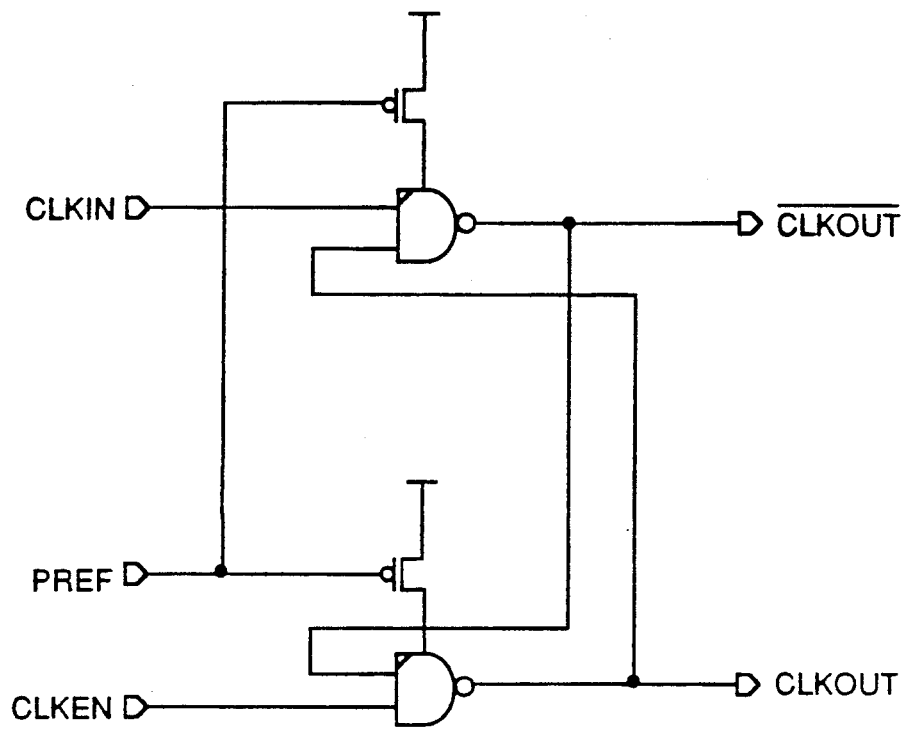
FIG. 6 is a schematic diagram of an alternate use of bias generator 39.

A second application of the bias generator circuit is in controlling the non-overlap between clock phases over PST corners. This may be done by using current controlled cross-coupled NAND gates wherein PREF is applied to control the current of the NAND gates as shown in FIG. 6.

A third use for the bias generator is as a gauge of processing quality by sending the outputs of the bias generator to a pad which is not bonded out. The reference voltages can then be measured to determine whether the part is acceptable.

A design for a high-performance CMOS output buffer utilizing current controlled predrivers wherein a PST compensating bias circuit has been described to provide tight control of AC switching characteristics as well as improved noise behavior.

We claim:

1. A process, supply and temperature compensating output buffer for a CMOS device comprising:
   a) input stage means for receiving and inverting an internal to the CMOS device data input signal, said input signal having a value which is one of the following transition from 0 to 1, or transition from 1 to 0;
   b) non-overlap stage means coupled to the input stage means for receiving said inverted input signal, a first tri-state control signal and a second tri-state control signal, said non-overlap stage means for charging a first node to a first voltage and then a second node to the first voltage when said input signal has the value of transition from 0 to 1, and for discharging said second node to a second voltage and then said first node to said second voltage when said input voltage has the value of transition from 1 to 0, wherein said first voltage is greater than said second voltage;
   c) predriver stage means coupled to said first and second nodes and said first and second tri-state control signals for controlling the current flow through said first and second nodes and inverting the signals at said first and second nodes to provide corresponding first and second output nodes;
   d) bias voltage generator means coupled to said predriver stage means for generating first and second bias voltages used by said predriver stage mean to provide said control of said current flow through said first and second nodes respectively;
   e) output stage means coupled to said first and second nodes for generating an output signal corresponding to said data input signal for placement on an output pad of said CMOS device.

2. The output buffer defined by claim 1 wherein said input stage means comprises a pair of transistors coupled in series between said first and second voltages so as to form an inverter.

3. The output buffer defined by claim 1 wherein said non-overlap stage means comprises a first and second set of transistors, each set of transistors being coupled in series between said first and second voltages wherein one transistor from each set is coupled to the output of said input stage means, at least two transistors from said first set are coupled to said first tri-state control signal and at least two transistors from said second set are coupled to said second tri-state control signal and said first and second set of transistors are coupled to each other to form said first and second nodes.

4. The output buffer defined by claim 1 wherein said predriver stage means comprises a first set of transistors coupled in series wherein one of said transistors from said first set is coupled to said first node and a second one of said transistors from said first set is coupled to said second node and a third one of said transistors from said first set is coupled to said first bias voltage, and one of said transistors from said second set is coupled to said first node and a second one of said transistors from said second set is coupled to said second node and a third one of said transistors from said first set is coupled to said second bias voltage.

5. The output buffer defined by claim 1 wherein for a first set of process, supply voltage and temperature corners and for a second set of process, supply voltage and temperature corners, said bias voltage generator means comprises:
   a) power down stage means for receiving an external signal and turning off all currents in said bias voltage generator means when said external signal is in one state and turning on all currents in said bias voltage generator means when said external signal is in a second state;
   b) reference current generation stage means for generating a reference current which provides compensation for current changes due to changes between said first and second sets of temperature corners, processes and supply voltages;
   c) first bias voltage output stage means coupled to said reference current generation stage means for generating said first bias voltage;
   d) second bias voltage output stage means coupled to said reference current generation stage means for generating said second bias voltage.

6. The output buffer defined by claim 1 wherein said output stage means comprises a first transistor coupled to said first node and a second transistor coupled to said second node, said first and second transistors coupled to each other in series and to a resistor.

7. The output buffer defined by claim 4 wherein said predriver stage means further comprises a low-pass filter coupled to said third one of said transistors from said second set to reduce switching noise transients created by said second bias voltage.

8. The output buffer defined by claim 5 wherein said power down stage means comprises first, second, third and fourth transistors coupled to an externally generated power down signal wherein two of said transistors are ON and two of said transistors are open when said power down signal is LO and said two ON transistors become OFF and said two open transistors become closed when said power down signal is HI.

9. The output buffer defined by claim 5 wherein said reference current generation stage means comprises a first transistor coupled between said first voltage and a first resistor, said first resistor being coupled in series to a second, third and fourth resistor, and a second transistor coupled between said fourth resistor and said second voltage, said reference current generation stage means further comprising third, fourth and fifth transistors coupled in series between said first and second voltages wherein a base connection of said third transistor is coupled to a node formed between said first and second resistors, a base connection of said fourth transistor is coupled to a node formed between said second and third resistors, and a base connection of said fifth transistor is coupled to a node formed between said fourth resistor and said second transistor, and a sixth transistor coupled between said first voltage and a node formed between said third and fourth transistors.

10. The output buffer defined by claim 9 wherein said first bias voltage output stage means comprises a seventh transistor whose base is coupled to a base connection of said sixth transistor, said seventh transistor being coupled between said first voltage and an eighth transistor, said eighth transistor being coupled to a fifth resistor, said fifth resistor being coupled to said second voltage, said first bias voltage output stage means further comprising a ninth transistor whose base is coupled to a node formed between said fourth and fifth transistors and which is coupled in parallel to said fifth resistor, wherein said first bias output voltage is at a node formed between said seventh and eighth transistors.

11. The output buffer defined by claim 10 wherein said second bias voltage output stage means comprises tenth and eleventh transistors coupled in series between said first and second voltages and twelfth, thirteenth and fourteenth transistors coupled in series between said first and second voltages wherein a base connection of said tenth transistor is coupled to the base of said seventh transistor, a base connection of said eleventh transistor is coupled to a base connection of said eighth transistor and a base connection of said fourteenth transistor, a base connection of said thirteenth transistor being coupled to a node formed between said tenth and eleventh transistors, wherein said second bias voltage is at a node formed between said twelfth and thirteenth transistors.

* * * * *

UNITED STATES PATENT AND TRADEMARK OFFICE
CERTIFICATE OF CORRECTION

PATENT NO. : 5,021,684
DATED : 6/4/91
INVENTOR(S) : Ahuja et al.

It is certified that error appears in the above-identified patent and that said Letters Patent is hereby corrected as shown below:

| | | |
|---|---|---|
| col. 06, line 64 | delete "$\sqrt{2b10}$" | insert -- $\sqrt{2*b10}$ -- |
| col. 06, line 66 | delete "b20*" | insert --b10*-- |
| col. 07, line 11 | delete "M10-M14" | insert --MB10-MB14-- |
| col. 08, line 06 | delete "mean" | insert --means-- |

Signed and Sealed this

Twenty-fifth Day of May, 1993

Attest:

MICHAEL K. KIRK

Attesting Officer

Acting Commissioner of Patents and Trademarks